(12) United States Patent
McKinstry

(10) Patent No.: US 10,317,481 B2
(45) Date of Patent: Jun. 11, 2019

(54) GIANT MAGNETORESISTIVE SENSOR HAVING HORIZONTAL STABILIZER

(71) Applicant: Oracle International Corporation, Redwood City, CA (US)

(72) Inventor: Kevin D. McKinstry, Westminster, CO (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/822,108

(22) Filed: Aug. 10, 2015

(65) Prior Publication Data

US 2015/0348575 A1     Dec. 3, 2015

Related U.S. Application Data

(62) Division of application No. 13/170,625, filed on Jun. 28, 2011, now Pat. No. 9,134,386.

(51) Int. Cl.
*G11B 5/39* (2006.01)
*G01R 33/09* (2006.01)

(52) U.S. Cl.
CPC ............ *G01R 33/093* (2013.01); *G11B 5/398* (2013.01); *Y10T 29/4902* (2015.01)

(58) Field of Classification Search
CPC ............ G11B 2220/90; G11B 2220/91; G11B 2220/913; G11B 2220/916; G11B 5/39; G11B 5/3906
USPC ................ 360/324; 428/811, 811.3; 134/134
See application file for complete search history.

(56) References Cited

U.S. PATENT DOCUMENTS

| | | |
|---|---|---|
| 4,477,794 A | 10/1984 | Nomura et al. |
| 4,566,050 A | 1/1986 | Beam et al. |
| 4,613,918 A | 9/1986 | Kanai et al. |
| 4,663,683 A | 5/1987 | Youda et al. |
| 5,287,238 A | 2/1994 | Baumgart et al. |
| 5,527,626 A | 6/1996 | Gijs et al. |
| 5,589,278 A | 12/1996 | Kamijo |
| 5,657,191 A * | 8/1997 | Yuan .................... G11B 5/3903 360/324 |
| 5,896,251 A | 4/1999 | Ohsawa et al. |
| 6,118,623 A | 9/2000 | Fatula, Jr. et al. |

(Continued)

OTHER PUBLICATIONS

Transition from AMR to GMR Heads in Tape Recording by John P. Nibarger, presented at the THIC Meeting at the National Center for Atmospheric Research, Aug. 21-22, 2007 (available at www.thic.org/pdf/August07/sun.Nibarger.pdf, accessed Jan. 11, 2018). pp. 1-30.

*Primary Examiner* — Tabassom Tadayyon Eslami
(74) *Attorney, Agent, or Firm* — Invoke

(57) ABSTRACT

A giant magnetoresistive (GMR) sensor for reading information from a magnetic storage medium has a first non-magnetoresistive layer, a first magnetoresistive layer formed on the first non-magnetoresistive layer, a second non-magnetoresitive layer formed on the first magnetoresistive layer, a second magnetoresistive layer formed on the second non-magnetoresistive layer, and a third non-magnetoresistive layer formed on the second magnetoresistive layer. The first non-magnetoresistive layer is provided with a single step on a surface of the first non-magnetoresistive layer. The step has an edge extending in a direction substantially parallel to a plane of a working surface of the GMR sensor.

9 Claims, 8 Drawing Sheets

(56) References Cited

U.S. PATENT DOCUMENTS

| | | | |
|---|---|---|---|
| 6,168,860 B1 * | 1/2001 | Daughton | B82Y 10/00 |
| | | | 257/E43.004 |
| 6,278,594 B1 | 8/2001 | Engel et al. | |
| 7,118,814 B1 | 10/2006 | Arnold et al. | |
| 7,227,726 B1 | 6/2007 | Denison et al. | |
| 7,256,969 B1 * | 8/2007 | Arnold | G01R 33/09 |
| | | | 360/313 |
| 7,492,554 B2 | 2/2009 | Breuer et al. | |
| 7,495,871 B1 | 2/2009 | Nibarger et al. | |
| 7,545,602 B1 | 6/2009 | McKinstry et al. | |
| 7,848,052 B2 | 12/2010 | McKinstry et al. | |
| 2002/0029462 A1 | 3/2002 | Spitzer et al. | |
| 2007/0121249 A1 * | 5/2007 | Parker | G01R 33/04 |
| | | | 360/123.1 |
| 2008/0266711 A1 | 10/2008 | Nibarger et al. | |
| 2008/0297954 A1 | 12/2008 | Aiso | |
| 2009/0046393 A1 | 2/2009 | Davey et al. | |
| 2009/0147389 A1 * | 6/2009 | Taratorin | G11B 5/3166 |
| | | | 360/31 |
| 2009/0213495 A1 | 8/2009 | McKinstry et al. | |

\* cited by examiner

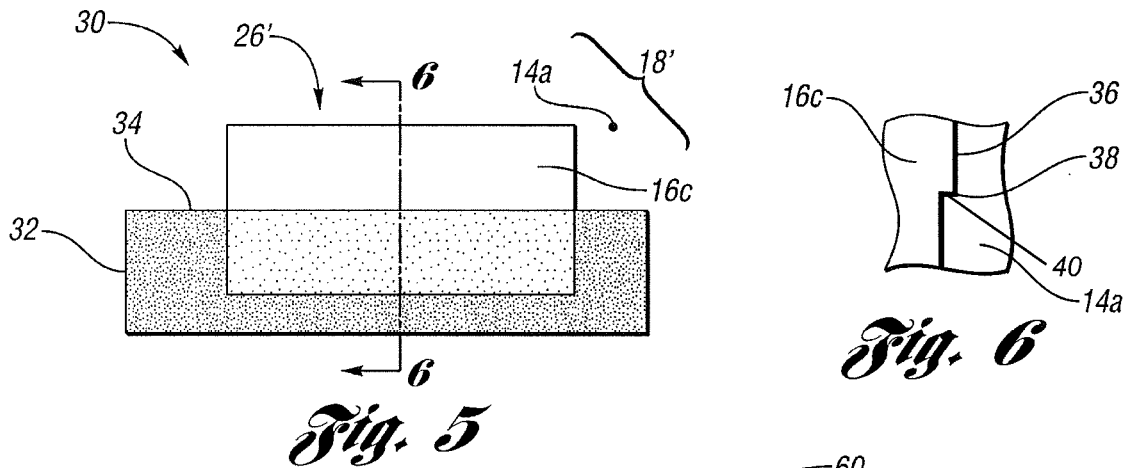
Fig. 5
Fig. 6
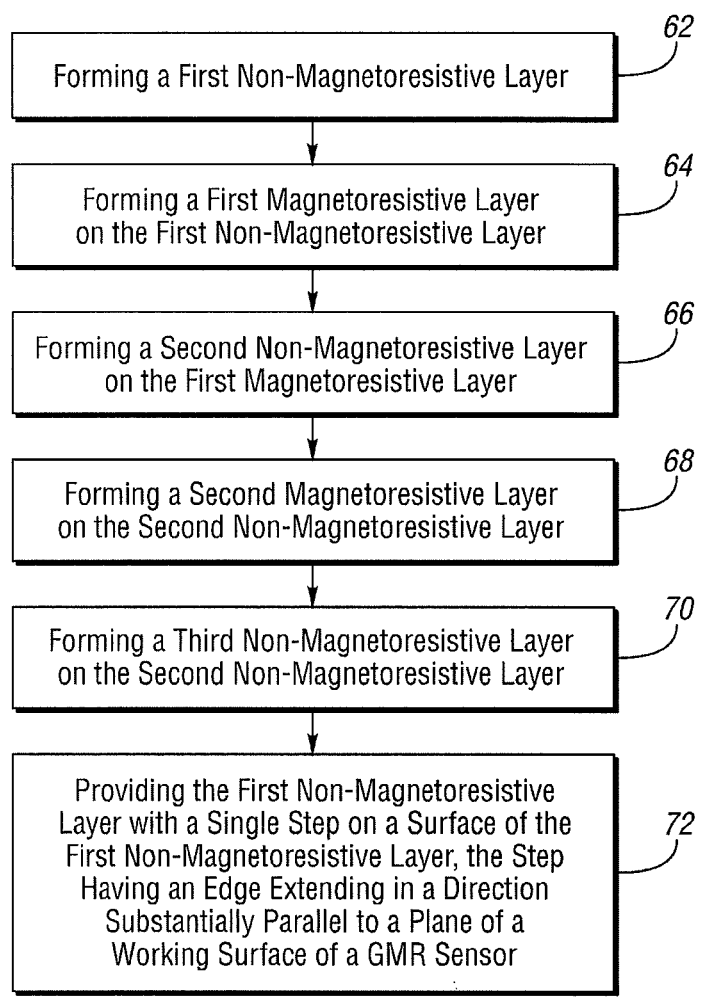
Fig. 7

GIANT MAGNETORESISTIVE SENSOR HAVING HORIZONTAL STABILIZER

CROSS-REFERENCE TO RELATED APPLICATION

This application is a divisional of U.S. patent application Ser. No. 13/170,625 filed on Jun. 28, 2011, the disclosure of which is incorporated in its entirety by reference herein.

TECHNICAL FIELD

The following relates to a giant magnetoresistive (GMR) sensor having a horizontal stabilizer provided therein.

BACKGROUND

Giant magnetoresistive (GMR) sensors used as read elements in magnetic data storage and retrieval systems need to operate in a linear and stable fashion. Especially when used as read elements in a multi-track read/write head in magnetic tape data storage and retrieval systems, GMR sensors also need to operate as close to equivalent to each other as possible.

GMR sensors, however, are unfortunately prone to defects which can cause instability and bias point changes during their operation in such data storage and retrieval systems. As a result, there exists a need for a GMR sensor that overcomes such problems. Such a GMR sensor would minimize the effects of such defects, thereby improving manufacturing yield and allowing the sensor to operate in a more stable fashion when used in data storage and retrieval systems.

More specifically, such a sensor would be built incorporating topographic features that provide equivalent magnetic fields large enough to minimize the effect of random manufacturing variations, thereby providing greater sensor equivalency in multi-track read/write heads. Such topographical features would comprise a step in a layer beneath the working surface of the GMR sensor. Such a step would be parallel to the working surface of the GMR sensor, such as the tape bearing surface of a GMR sensor in a magnetic tape data storage and retrieval system. Such a feature would provide for a GMR sensor which allows multi-track GMR heads to be built with better yield, better performance, and less sensor variation between tracks.

SUMMARY

According to one embodiment disclosed herein, a giant magnetoresistive (GMR) sensor for reading information from a magnetic storage medium is provided. The GMR sensor has a working surface oriented proximate the magnetic storage medium during operation of the GMR sensor. The GMR sensor comprises a first non-magnetoresistive layer, a first magnetoresistive layer formed on the first non-magnetoresistive layer, a second non-magnetoresitive layer formed on the first magnetoresistive layer, a second magnetoresistive layer formed on the second non-magnetoresistive layer, and a third non-magnetoresistive layer formed on the second magnetoresistive layer. The first non-magnetoresistive layer is provided with a single step on a surface of the first non-magnetoresistive layer, the step having an edge extending in a direction substantially parallel to a plane of the working surface of the GMR sensor.

According to another embodiment, a giant magnetoresistive (GMR) sensor is provided for reading information from a magnetic storage medium, the GMR sensor having a working surface oriented proximate the magnetic storage medium during operation of the GMR sensor. The GMR sensor comprises a plurality of sensor stack layers comprising a plurality of non-magnetoresistive layers, and a plurality of magnetoresistive layers interposed between the plurality of non-magnetoresistive layers. Each of the plurality of sensor stack layers is provided with a single step on a surface thereof, each step provided on the surface of each layer being substantially coextensive with the step provided on the surface of an adjacent layer. Each step has an edge extending in a direction substantially parallel to a plane of the working surface of the GMR sensor.

According to a further embodiment, a method for manufacturing a giant magnetoresistive (GMR) sensor for reading information from a magnetic storage medium is provided. The GMR sensor has a working surface oriented proximate the magnetic storage medium during operation of the GMR sensor. The method comprises forming a first non-magnetoresistive layer, forming a first magnetoresistive layer on the first non-magnetoresistive layer, and forming a second non-magnetoresitive layer on the first magnetoresistive layer. The method further comprises forming a second magnetoresistive layer on the second non-magnetoresistive layer, and forming a third non-magnetoresistive layer on the second magnetoresistive layer. The method still further comprises providing the first non-magnetoresistive layer with a single step on a surface of the first non-magnetoresistive layer, the step having an edge extending in a direction substantially parallel to a plane of the working surface of the GMR sensor.

A detailed description of these embodiments and accompanying drawings is set forth below.

BRIEF DESCRIPTION OF THE DRAWINGS

FIGS. 5, 5b and 5c are top views of an embodiment of the GMR sensor disclosed herein with a stabilizer pattern formed therein;

FIGS. 6, 6b and 6c are edge-on views of the embodiment of the GMR sensor disclosed herein and depicted in FIGS. 5, 5b and 5c, taken along the lines 6-6, 6b-6b and 6c-6c thereof showing the stabilizer pattern formed therein;

FIG. 7 is an exemplary flowchart depicting an embodiment of a method for manufacturing a GMR sensor as disclosed herein;

DETAILED DESCRIPTION

Figure 1:
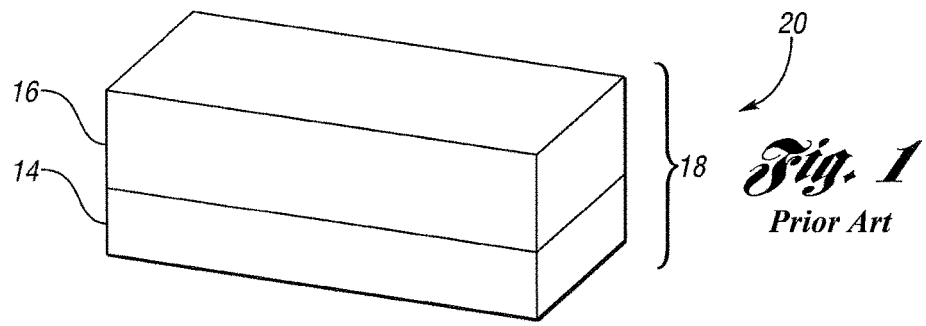
FIG. 1 is a perspective view of material layers for use in a prior art anisotropic magnetoresistive (AMR) sensor.

With reference to FIGS. 1-12, a giant magnetoresistive (GMR) sensor having a horizontal stabilizer provided therein and a method for manufacturing such a GMR sensor will be described. For ease of illustration and to facilitate understanding, like reference numerals may be used herein for like components and features throughout the drawings.

As previously noted, GMR sensors used as read elements in magnetic data storage and retrieval systems need to operate in a linear and stable fashion. Such GMR sensors also need to operate as close to equivalent to each other as possible, especially when used as read elements in a multi-track read/write head in magnetic tape data storage and retrieval systems.

GMR sensors, however, are prone to defects which can cause instability and bias point changes during their operation in such data storage and retrieval systems. The GMR sensor disclosed herein minimizes such defects, thereby improving manufacturing yield and allowing the GMR sensor to operate in a more stable fashion in data storage and retrieval systems. The GMR sensor is built incorporating topographic features comprising a step in a layer beneath the working surface of the GMR sensor, such as the tape bearing surface of a GMR sensor in a magnetic tape data storage and retrieval system, where the step is configured parallel to the GMR sensor working surface (i.e., "horizontal"). Such features provide equivalent magnetic fields large enough to minimize the effect of random manufacturing variations, thereby improving yield and providing greater sensor equivalency in multi-track read/write heads.

Referring now to FIG. 1, a perspective view is shown of material layers for use in a prior art anisotropic magnetoresistive (AMR) sensor. As seen therein, an AMR sensor includes a non-magnetoresistive layer (14) and a magnetoresistive layer (16), which together may be referred to as a film stack (18). The non-magnetoresistive layer (14) may comprise Cobalt-Zirconium-Tantalum (CoZrTa), while the magnetoresistive layer (16) may comprise Nickel-Iron (NeFe). As is well known in the art, such an AMR sensor may be manufactured by creating or forming the non-magnetoresistive and magnetoresistive layers (14, 16) using film deposition techniques. As is also well known, one side (20) of the film stack (18) will be formed in a known fashion into a working surface for the AMR sensor, which surface will be oriented proximate a magnetic storage medium (not shown) during operation of the AMR sensor. In a data storage and retrieval system employing magnetic tape as the storage medium, the working surface of the AMR sensor will be the tape bearing surface where the AMR sensor makes contact with the magnetic tape (not shown).

Figure 2:
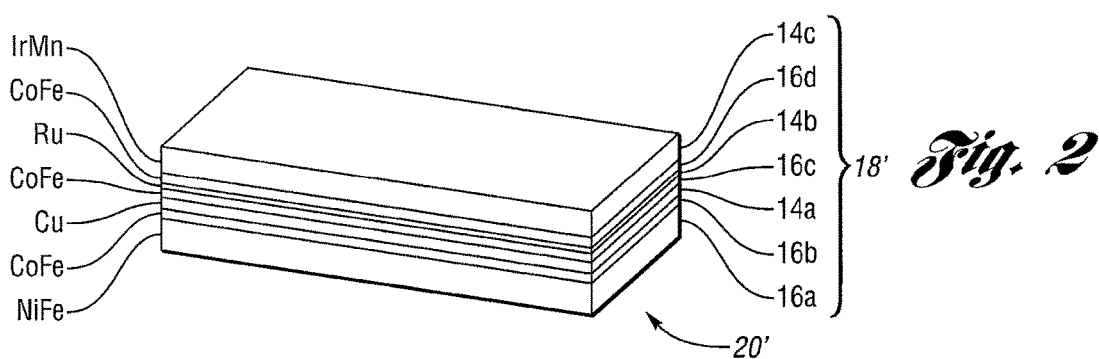
FIG. 2 is a perspective view of exemplary material layers for use in a giant magnetoresistive (GMR) sensor.

A perspective view of exemplary material layers for use in a GMR sensor is shown in FIG. 2. As seen therein, a GMR sensor comprises a plurality of non-magnetoresistive layers ($14a$, $14b$, $14c$) and a plurality of magnetoresistive layers ($16a$, $16b$, $16c$, $16d$). Here again, as is well known in the art, a GMR sensor may also be manufactured by creating or forming the non-magnetoresistive and magnetoresistive layers ($14a$-$c$, $16a$-$d$) using film deposition techniques. In that regard, the film stack ($18'$) of a GMR sensor may comprise a series of adjacent, alternating or interposed non-magnetoresistive layers ($14a$-$c$) and magnetoresistive layers ($16a$-$d$). As is also well known, one side ($20'$) of the film stack ($18'$) will be formed in a known fashion into a working surface for the GMR sensor, which surface will be oriented proximate a magnetic storage medium (not shown) during operation of the GMR sensor. Here again, in a data storage and retrieval system employing magnetic tape as the storage medium, the working surface of the GMR sensor will be the tape bearing surface where the GMR sensor makes contact with the magnetic tape (not shown).

As seen in FIG. 2, one non-magnetoresistive layer ($14a$) may comprise Copper (Cu), another non-magnetoresistive layer ($14b$) may comprise Ruthenium (Ru), and still another non-magnetoresistive layer ($14c$) may comprise Iridium-Manganese (IrMn). Magnetoresistive layers ($16a$, $16b$) may comprise Nickel-Iron (NiFe) and Cobalt-Iron (CoFe), respectively. Additional magnetoresistive layers ($16c$, $16d$) may comprise Cobalt-Iron (CoFe). It should be noted, however, that the particular magnetoresistive and non-magnetoresistive materials identified herein are exemplary only. Other magnetoresistive and non-magnetoresistive materials may also be employed.

Figure 3:
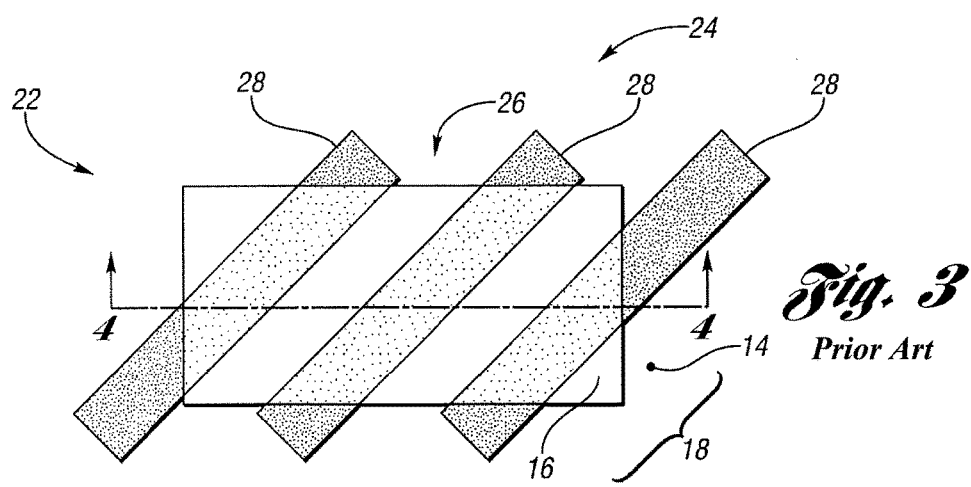
FIG. 3 is a top view of a prior art AMR sensor with a stabilizer pattern formed therein.

Referring next to FIG. 3, a top view of a prior art AMR sensor (22) is shown, including a stabilizer pattern (24) formed therein. The use of topographical stabilizer techniques and features is well established in the manufacture of AMR sensor read/write heads in order to improve AMR sensor performance when used in magnetic tape data storage and retrieval systems. The salient features of such stabilizers are multiple step height changes beneath the working surface of the sensor.

More specifically, as seen in FIG. 3, a film stack (18) of AMR sensor (22) includes a magnetoresistive layer (16) oriented on top of a non-magnetoresistive layer (14). The film stack (18) will be provided in a known fashion with a working surface (26), which will be oriented proximate a magnetic storage medium (not shown) during operation of the AMR sensor (22). In a data storage and retrieval system where the magnetic storage medium is a magnetic tape, the working surface (26) of the AMR sensor (22) will be the tape bearing surface where the AMR sensor (22) makes contact with a magnetic tape (not shown).

Referring still to FIG. 3, the stabilizer pattern (24) provided in the AMR sensor (22) comprises multiple troughs (28) on the surface of the non-magnetoresistive layer (14) adjacent the magnetoresistive layer (16). As can be seen, the troughs (28) are oriented at a 45° angle relative to a plane formed by the working surface (26) of the AMR sensor (22).

Figure 4:
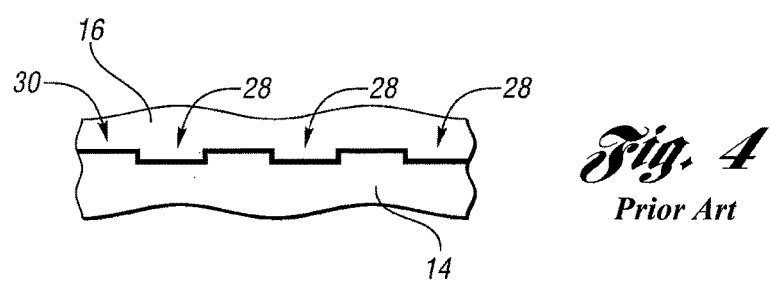
FIG. 4 is an edge-on view of the prior art AMR sensor depicted in FIG. 3, taken along the line 4-4 thereof showing the stabilizer pattern formed therein.

FIG. 4 shows an edge-on view of the prior art AMR sensor (22) depicted in FIG. 3, taken along the line 4-4 thereof. In that regard, FIG. 4 illustrates the stabilizer pattern (24) formed in the AMR sensor (22). As seen therein, multiple troughs (28) provided or formed in the non-magnetoresistive layer (14) create a series of step height changes on surface (30) of the non-magnetoresistive layer (14) adjacent magnetoresistive layer (16). In that regard, it should be noted that the troughs (28) and concomitant surface step height changes may be formed, produced or provided in any known fashion, including chemical processes such as photolithography, or mechanical processes such as machining or ion milling.

Referring next to FIG. 5, a top view is shown of an embodiment of a GMR sensor (30) disclosed herein, including a stabilizer pattern (32) formed therein. With reference again to FIGS. 1 and 2, GMR sensors differ from AMR sensors in that GMR sensors are composed of a stack of multiple film layers, which are relatively thin in comparison to the material layers used in AMR sensors. In view of the relatively thin nature of the layers in a GMR sensor stack, it was thought that any step height changes provided in those layers would damage the film integrity, thereby rendering the GMR sensor substantially inoperable. As a result, it was believed that topographical stabilization features could not be used in GMR sensors.

Figure 5B:
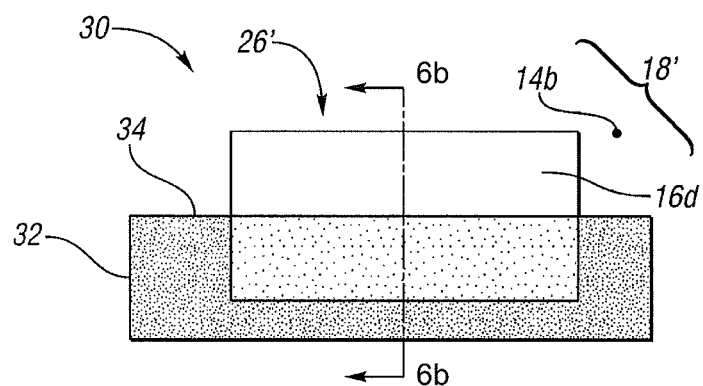
Figure 5C:
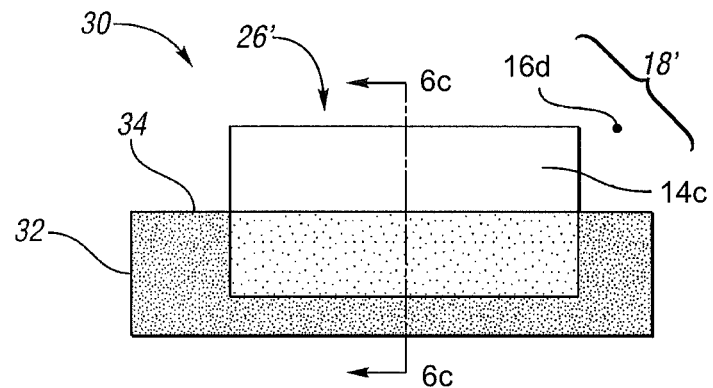

Recent experiments with GMR sensors, however, have indicated that topographical stabilizers can be quite successfully implemented. Indeed, stabilizers used in GMR sensors may be simpler than those used in AMR sensors in that only a single step, which may progress across the width of the GMR sensor, may be provided. In that regard, as seen in FIGS. 5, 5b and 5c, a portion of a film stack (18') of GMR sensor (30) includes a magnetoresistive layer (16c, 16d) oriented on top of a non-magnetoresistive layer (14a, 14b), or a non-magnetoresistive layer (14c) on top of a magnetoresistive layer (16d). The film stack (18') will be provided in a known fashion with a working surface (26'), which will be oriented proximate a magnetic storage medium (not shown) during operation of the GMR sensor (30). In a data storage and retrieval system where the magnetic storage medium is a magnetic tape, the working surface (26') of the GMR sensor (30) will be the tape bearing surface where the GMR sensor (30) makes contact with a magnetic tape (not shown).

Still referring to FIGS. 5, 5b and 5c, the stabilizer pattern (32) provided in the GMR sensor (30) comprises a single step (34) on the surface of the non-magnetoresistive layer (14a, 14b) adjacent the magnetoresistive layer (16c. 16d), or the non-magnetoresistive layer (14c) adjacent the magnetoresistive layer (16d). As can be seen, the step (34) is oriented substantially parallel to a plane formed by the working surface (26') of the GMR sensor (30). In that regard, as it is oriented substantially parallel to the horizontal plane of the working surface (26'), the step (34) provides a topographical feature that may be referred to as a horizontal stabilizer.

Figure 6B:
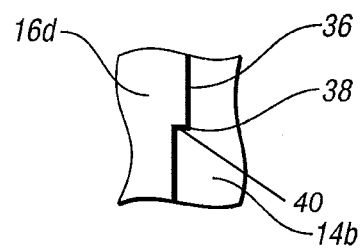
Figure 6C:
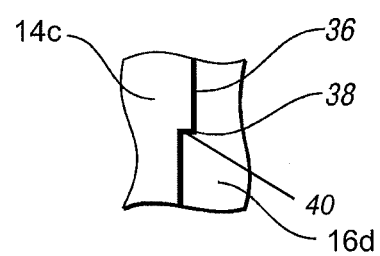

Referring now to FIGS. 6, 6b and 6c, edge-on views of the GMR sensor (30) depicted in FIGS. 5, 5b and 5c are shown, taken along the lines 6-6, 6b-6b and 6c-6c thereof. In that regard, FIGS. 6, 6b and 6c illustrate the stabilizer pattern (32) formed in the GMR sensor (30). As seen therein, the single step (34) provided or formed in the non-magnetoresistive layer (14a, 14b) or the magnetoresistive layer (16d) creates a step height change on surface (36) of the non-magnetoresistive layer (14a, 14b) adjacent magnetoresistive layer (16c, 16d), or the magnetoresistive layer (16d) adjacent non-magnetoresistive layer (14c), thereby forming a transitional surface (40) between first and second levels of the surface (36). The step (34) has an edge (38) that extends in a direction substantially parallel to a plane formed by the working surface (26') (see, FIGS. 5, 5b and 5c) of the GMR sensor (30), which may be a tape bearing surface. Once again, it should be noted that the step (34) and concomitant surface height change may be formed, produced or provided in any known fashion, including through the use of any chemical and/or mechanical process.

With reference to FIGS. 5 and 6, as previously described, the step (34), including the edge (38) thereof, may extend across substantially the entire width of the GMR sensor (30). Moreover, while a step (34) is shown in one non-magnetoresistive layer (14a), a similar step may be provided on a surface of as many as all of the multiple magnetoresistive and non-magnetoresistive layers in sensor stack (18') that make up GMR sensor (30). In that regard, each such step may be substantially coextensive with the step provided in an adjacent layer, so that the steps in each layer are substantially aligned in the sensor stack (18') (see, FIG. 2) and/or extend across substantially the entire width of the GMR sensor (30).

Referring next to FIG. 7, an exemplary flowchart is shown of an embodiment of a method (60) for manufacturing a GMR sensor as disclosed herein. As previously described, the GMR sensor is for reading information from a magnetic storage medium, and has a working surface oriented proximate the magnetic storage medium during operation of the GMR sensor.

As seen in FIG. 7, the method (60) may comprise forming (62) a first non-magnetoresistive layer, forming (64) a first magnetoresistive layer on the first non-magnetoresistive layer, and forming (66) a second non-magnetoresitive layer on the first magnetoresistive layer. The method (60) may further comprise forming (68) a second magnetoresistive layer on the second non-magnetoresistive layer; and forming (70) a third non-magnetoresistive layer on the second magnetoresistive layer. Once again, such magnetoresistive and non-magnetoresistive layers may comprise any of a number of materials, as discussed above in connection with FIGS. 1-6.

Still referring to FIG. 7, the method (60) for manufacturing a GMR sensor may further comprise providing (72) the first non-magnetoresistive layer with a single step on a surface of the first non-magnetoresistive layer, the step having an edge extending in a direction substantially parallel to a plane of the working surface of the GMR sensor. As previously discussed in connection with FIGS. 1-6, the magnetic storage medium may comprise a magnetic tape, the working surface of the GMR sensor may comprise a tape bearing surface, and the edge of the step provided on the surface of the first non-magnetoresistive layer thereby extends in a direction substantially parallel to a plane of the tape bearing surface of the GMR sensor.

The method (60) for manufacturing a GMR sensor may further comprise providing the first magnetoresistive layer with a single step on a surface thereof, where the step provided on the surface of the first magnetoresistive layer is substantially coextensive with the step provided on the surface of the first non-magnetoresistive layer. As previously discussed, the single step provided on the surface of the first non-magnetoresistive layer and the single step provided on the surface of the first magnetoresistive layer may extend across substantially an entire width of the GMR sensor.

The method (60) may still further comprise providing each of the first magnetoresistive layer, the second non-magnetoresistive layer, the second magnetoresistive layer, and the third non-magnetoresistive layer with a single step on a surface thereof, where each step provided on the surface of each layer is substantially coextensive with the step proved on the surface of an adjacent layer. Here again, each of the coextensive steps provided on the surface of each layer may extend across substantially an entire width of the GMR sensor. Moreover, as discussed above in connection with FIGS. 1-6, the single step provided on the surface of any of the magnetoresistive or non-magnetoresistive layers may be produced by a chemical or a mechanical process. It should also be noted that while FIG. 7 shows the steps of the method (60) described herein being executed in a particular order, that order is exemplary only. Such steps may be executed in a different order than that depicted, which may include simultaneous execution of particular steps.

Figure 8:
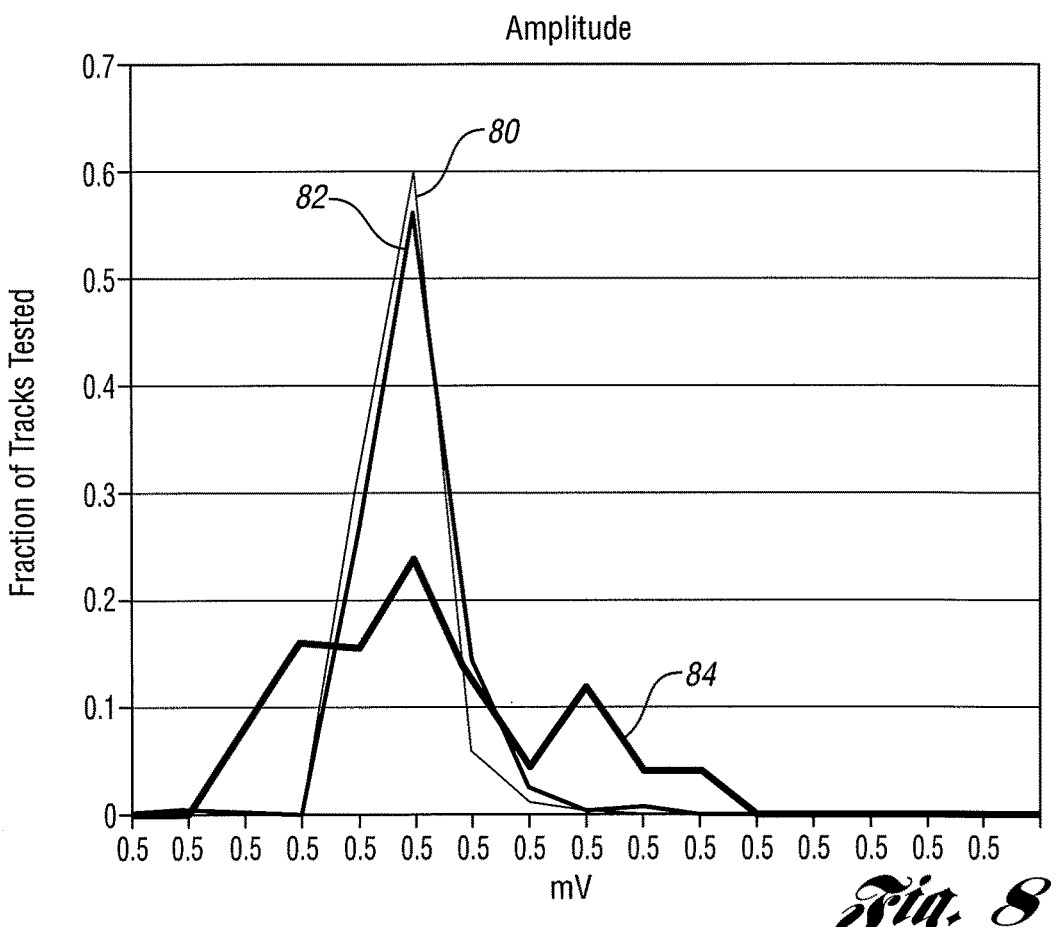
FIG. 8 is a plot depicting amplitude output for multi-sensor GMR heads having horizontal stabilizers as disclosed herein in comparison to a prior art multi-sensor GMR head without stabilization.

Performance measurements of embodiments of GMR sensors as described herein with horizontal stabilizers in comparison to GMR sensors lacking such features are shown in FIGS. 8-12. Referring first to FIG. 8, a plot depicting amplitude output for multi-sensor GMR heads (80, 82) having horizontal stabilizers as disclosed herein is shown in comparison to a prior art multi-sensor GMR head (84) without stabilization. As seen therein, output on stabilized GMR heads (80, 82) is more tightly controlled than on non-stabilized GMR head (84). While the mean amplitude for stabilized GMR heads (80, 82) has dropped relative to non-stabilized GMR head (84), that lower mean amplitude results from of a lack of high output outliers for stabilized GMR heads (80, 82) as compared to non-stabilized GMR head (84).

Figure 9:
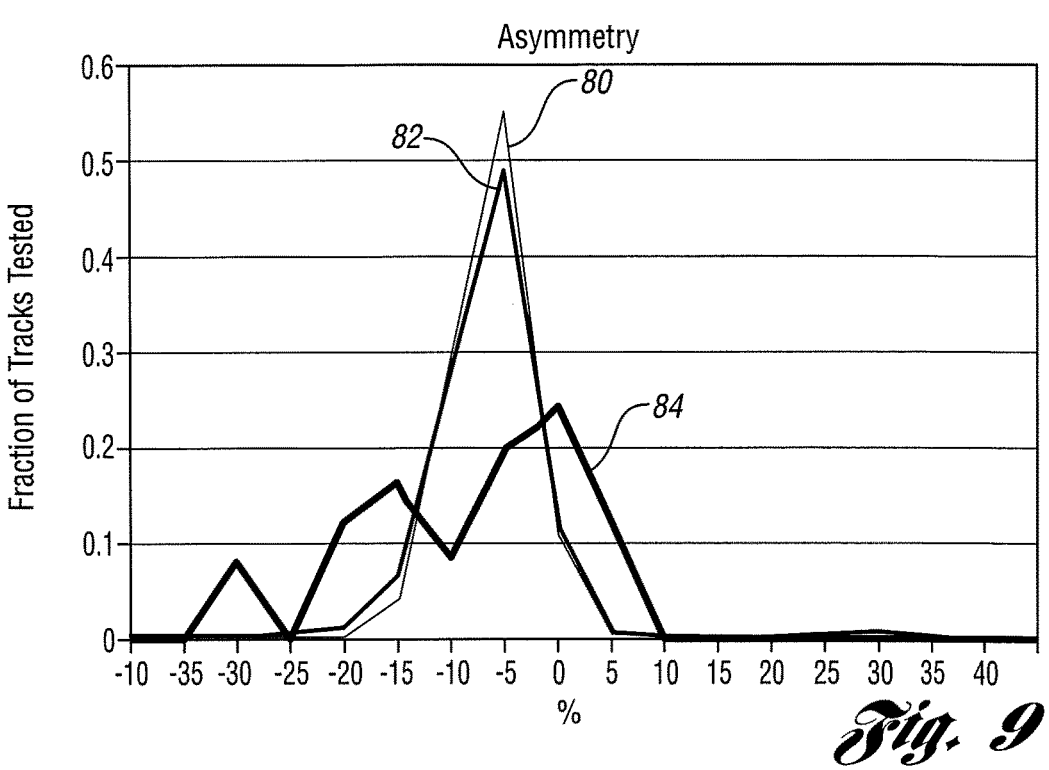
FIG. 9 is a plot depicting asymmetry for multi-sensor GMR heads having horizontal stabilizers as disclosed herein in comparison to a prior art multi-sensor GMR head without stabilization.

Referring next to FIG. 9, a plot depicting asymmetry for multi-sensor GMR heads (80, 82) having horizontal stabilizers as disclosed herein is shown in comparison to a prior art multi-sensor GMR head (84) without stabilization. As seen therein, asymmetry on stabilized GMR heads (80, 82) is more tightly controlled that in non-stabilized GMR head (84). The distribution for stabilized GMR heads (80, 82) is more Gaussian than for non-stabilized GMR head (84), without the large negative asymmetry tail of non-stabilized GMR head (84).

Figure 10:
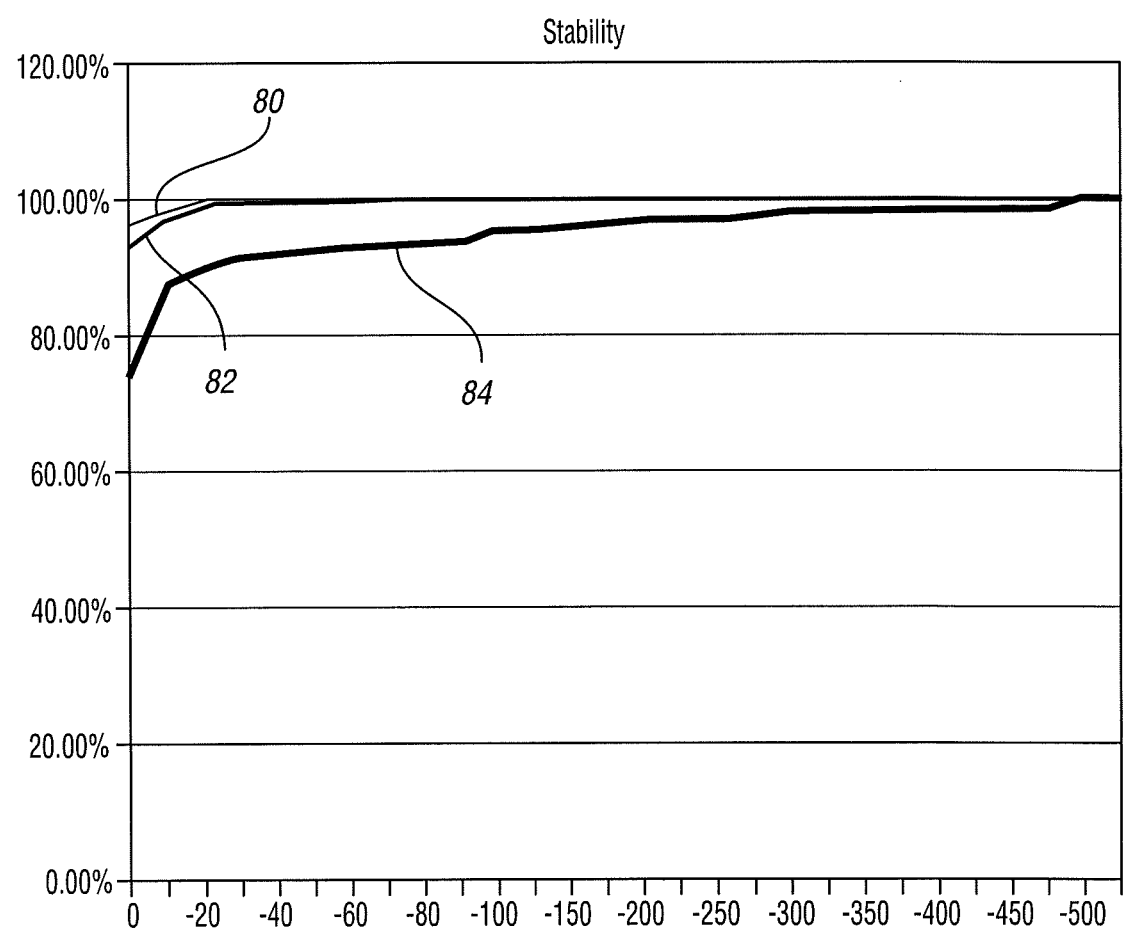
FIG. 10 is a plot depicting stability for multi-sensor GMR heads having horizontal stabilizers as disclosed herein in comparison to a prior art multi-sensor GMR head without stabilization.

FIG. 10 is a plot depicting stability for multi-sensor GMR heads (80, 82) having horizontal stabilizers as disclosed herein in comparison to a prior art multi-sensor GMR head (84) without stabilization. In that regard, while stability measurements for GMR heads are better displayed as a cumulative distribution function, it is nevertheless easy to distinguish from FIG. 10 that stabilized GMR heads (80, 82) outperform non-stabilized GMR head (84).

Figure 11:
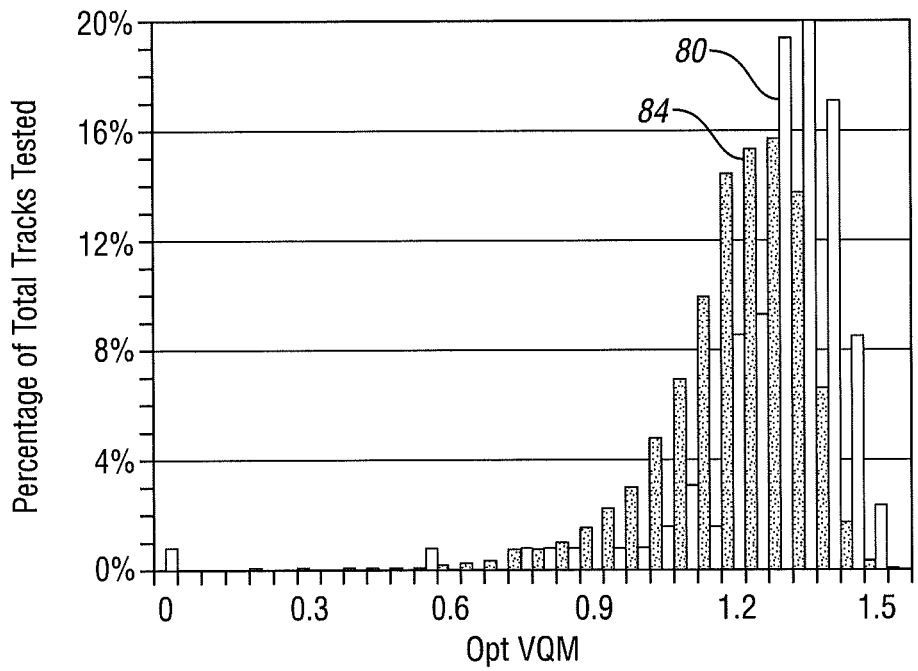
FIG. 11 is a plot depicting Viterbi Quality Metric (VQM) for a multi-sensor GMR head having horizontal stabilizers as disclosed herein in comparison to a prior art multi-sensor GMR head without stabilization.

Referring now to FIG. 11, a plot depicting Viterbi Quality Metric (VQM) for a multi-sensor GMR head (80) having horizontal stabilizers as disclosed herein is shown in comparison to a prior art multi-sensor GMR head (84) without stabilization. As seen therein, magnetic tape drive test results show that stabilized GMR head (80) has a higher VQM on average than non-stabilized GMR head (84), as well as a much reduced low VQM tail.

Figure 12:
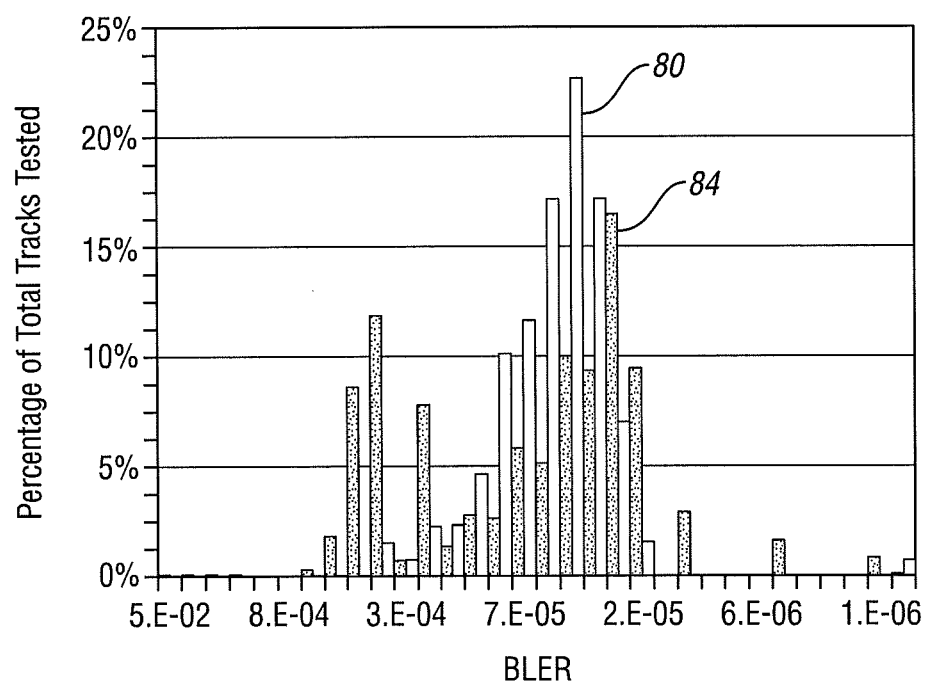
FIG. 12 is a plot of block error rate for a multi-sensor GMR head having horizontal stabilizers as disclosed herein in comparison to a prior art multi-sensor GMR head without stabilization.

FIG. 12 is a plot of block error rate (BLER) for a multi-sensor GMR head having horizontal stabilizers as disclosed herein in comparison to a prior art multi-sensor GMR head without stabilization. As seen therein, magnetic tape drive test results shown that stabilized GMR head (80) has a good block error rate, and does not have the subset of sensors with poorer error rates as does the non-stabilized GMR head (84).

As can be seen from the plots of FIGS. 8-12, multi-sensor GMR heads with horizontal stabilizers improve parametric performance by producing a tighter distribution of amplitude, producing a tighter distribution of asymmetry, and reducing the incidence of unstable sensors to lower levels than multi-sensor GMR heads without stabilization. As well, in terms of drive performance, stabilized GMR heads lead to a higher and better controlled VQM, lower the incidence of higher error rate sensors, and result in lower values of boost in the drive than non-stabilized GMR heads.

Figure 13:
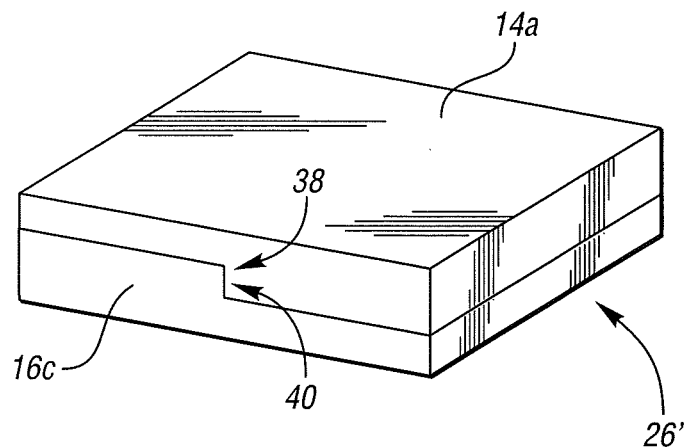
FIG. 13 is a perspective view of exemplary layers of the material layers for use in a giant magnetoresistive (GMR) sensor shown in FIG. 2.
Figure 14:
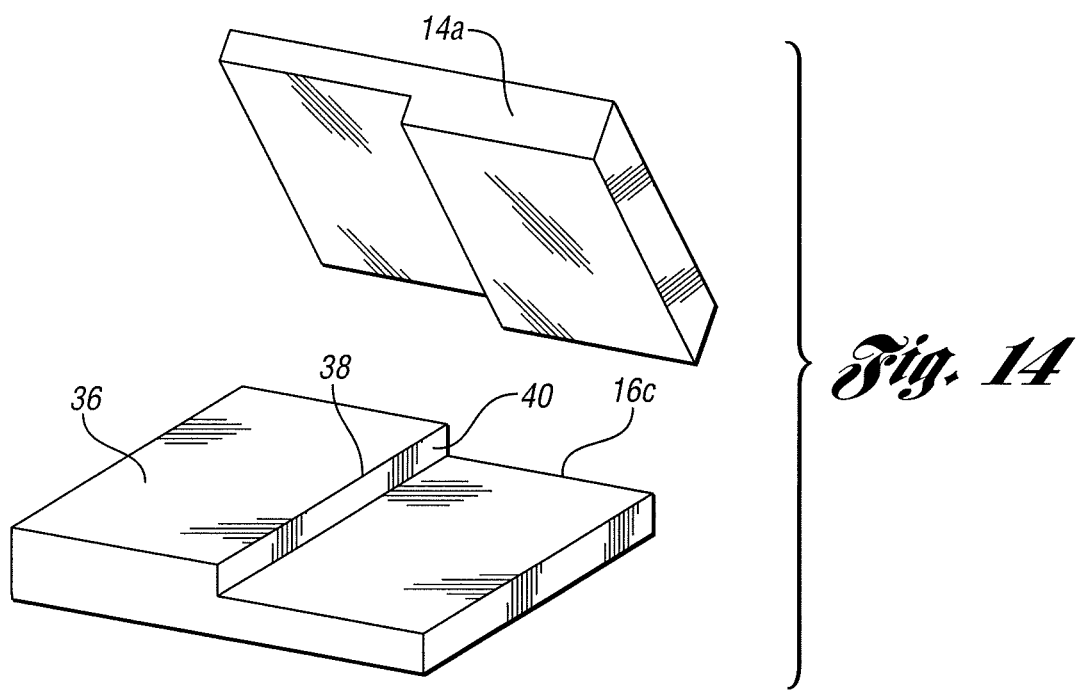
FIG. 14 is an exploded view of the exemplary layers of the material layers for use in a giant magnetoresistive (GMR) sensor shown in FIG. 13.

Referring now to FIGS. 13 and 14, perspective and exploded views are shown of exemplary layers of the material layers of the stack (18') shown in FIG. 2. As seen therein, and with continuing reference to FIGS. 2, 5 and 6, the stabilizer pattern (32) in the GMR sensor (30) comprises a single step (34) on the surface (36) of the non-magnetoresistive layer (14a) adjacent the magnetoresistive layer (16c). The step (34) is oriented substantially parallel to a plane formed by the working surface (26') of the GMR sensor (30), and therefore provides a topographical feature that may be referred to as a horizontal stabilizer. The single step (34) provided or formed in the non-magnetoresistive layer (14a) creates a step height change on surface (36) of the non-magnetoresistive layer (14a) adjacent magnetoresistive layer (16b). The step (34) has an edge (38) that extends in a direction substantially parallel to a plane formed by the working surface (26') of the GMR sensor (30), which may be a tape bearing surface. The step (34) thus provides a transitional surface (40) in the non-magnetoresistive layer (14a) between first and second levels of the surface (36) of the non-magnetoresistive layer (14a) and has an edge (38) along a line formed by a junction of the transitional surface (40) and the first level of the surface (36) of the non-magnetoresistive layer (14a), where the edge (38) extends in a direction substantially parallel to a plane formed by the working surface (26') of the GMR sensor (30). The step (34), including the edge (38) thereof, may extend across substantially the entire width of the GMR sensor (30). While a step (34) is shown in one non-magnetoresistive layer (14a), a similar step may be provided on a surface of as many as all of the multiple mangetoresistive and non-magnetoresistive layers in the sensor stack (18') that make up GMR sensor (30). Each such step may be substantially coextensive with the step provided in an adjacent layer, so that the steps in each layer are substantially aligned in the sensor stack (18') and/or extend across substantially the entire width of the GMR sensor (30).

As is readily apparent from the foregoing description, a GMR sensor has been disclosed that minimizes defects which can cause instability and bias point changes during sensor operation, thereby improving manufacturing yield and allowing the GMR sensor to operate in a more stable fashion when used in magnetic data storage and retrieval systems. The GMR sensor is built incorporating topographic features comprising a step in a layer beneath the working surface of the GMR sensor, such as the tape bearing surface of a GMR sensor in a magnetic tape data storage and retrieval system, and is configured parallel to that GMR sensor working surface (i.e., "horizontal"). Such features provide equivalent magnetic fields large enough to minimize the effect of random manufacturing variations, thereby providing greater sensor equivalency in multi-track read/write heads. Such a GMR sensor allows multi-track GMR heads to be built with better yield, better performance, and less sensor-to-sensor variation.

While certain embodiments of a GMR sensor having a horizontal stabilizer have been illustrated and described herein, they are exemplary only and it is not intended that these embodiments illustrate and describe all those possible. Rather, the words used herein are words of description rather than limitation, and it is understood that various changes may be made without departing from the spirit and scope of the following claims.

What is claimed is:

1. A method for manufacturing a giant magnetoresistive (GMR) sensor for reading information from a magnetic storage medium, the GMR sensor having a working surface oriented proximate the magnetic storage medium during operation of the GMR sensor, the method comprising:

forming a first non-magnetoresistive layer;

forming a first magnetoresistive layer on the first non-magnetoresistive layer;

forming a second non-magnetoresitive layer on the first magnetoresistive layer;

forming a second magnetoresistive layer on the second non-magnetoresistive layer;

providing the first non-magnetoresistive layer with only a single step on a surface thereof, the step providing a transitional surface in the first non-magnetoresistive layer between first and second levels of the surface of the first non-magnetoresistive layer and having an edge along a line formed by a junction of the transitional surface and the first level of the surface of the first non-magnetoresistive layer, the edge extending in a direction substantially parallel to a plane of the working surface of the GMR sensor; and providing the first magnetoresistive layer with only a single step on a surface thereof, the step provided on the surface of the first magnetoresistive layer being substantially coextensive with the step provided on the surface of the first non-magnetoresistive layer;

wherein the single step provided on the surface of the first non-magnetoresistive layer and the single step provided on the surface of the first magnetoresistive layer each extend horizontally across substantially an entire width of the GMR sensor.

2. The method of claim 1 wherein the magnetic storage medium comprises a magnetic tape, the working surface of the GMR sensor comprises a tape bearing surface, and the edge of the step provided on the surface of the first non-magnetoresistive layer extends in a direction substantially parallel to a plane of the tape bearing surface of the GMR sensor.

3. The method of claim 1 further comprising providing each of the the first magnetoresistive layer, the second non-magnetoresistive layer, and the second magnetoresistive layer with a single step on a surface thereof, each step provided on the surface of each layer being substantially coextensive with the step proved on the surface of an adjacent layer.

4. The method of claim 1 wherein the single step provided on the surface of the first non-magnetoresistive layer is produced by a chemical process.

5. The method of claim 1 wherein the single step provided on the surface of the first non-magnetoresistive layer is produced by a mechanical process.

6. A method for manufacturing a giant magnetoresistive (GMR) sensor for reading information from a magnetic storage medium, the GMR sensor having a working surface oriented proximate the magnetic storage medium during operation of the GMR sensor, the method comprising:

forming a plurality of non-magnetoresistive layers;

forming a plurality of magnetoresistive layers interposed between the plurality of non-magnetoresistive layers; and providing each of the plurality of layers with only a single step on a surface thereof, each step on the surface of each layer being substantially coextensive with the step provided on the surface of an adjacent layer, each step providing a transitional surface in the associated layer between first and second levels of the surface of the associated layer and having an edge along a line formed by a junction of the transitional surface and the first level of the surface of the associated layer, the edge extending in a direction substantially parallel to a plane of the working surface of the GMR sensor;

wherein each step provided on the surface of each of the plurality of layers extends horizontally across substantially an entire width of the GMR sensor.

7. The method of claim 6 wherein the magnetic storage medium comprises a magnetic tape, the working surface of the GMR sensor comprises a tape bearing surface.

8. The method of claim 6 wherein at least one of the steps provided on the surfaces of the plurality of layers is produced by a chemical process.

9. The method of claim 6 wherein at least one of the steps provided on the surfaces of the plurality of layers is produced by a mechanical process.

* * * * *

UNITED STATES PATENT AND TRADEMARK OFFICE
CERTIFICATE OF CORRECTION

PATENT NO. : 10,317,481 B2  
APPLICATION NO. : 14/822108  
DATED : June 11, 2019  
INVENTOR(S) : McKinstry It is certified that error appears in the above-identified patent and that said Letters Patent is hereby corrected as shown below:

On the Title Page

In Column 2, under Abstract, Lines 4-5, delete "non-magnetoresitive" and insert -- non-magnetoresistive --, therefor.

In the Specification

In Column 1, Line 57, delete "non-magnetoresitive" and insert -- non-magnetoresistive --, therefor.

In Column 2, Line 22, delete "non-magnetoresitive" and insert -- non-magnetoresistive --, therefor.

In Column 3, Line 56, delete "(NeFe)." and insert -- (NiFe). --, therefor.

In Column 5, Line 41, delete "(16c. 16d)," and insert -- (16c, 16d), --, therefor.

In Column 6, Line 26, delete "non-magnetoresitive" and insert -- non-magnetoresistive --, therefor.

In Column 8, Line 31, delete "mangetoresistive" and insert -- magnetoresistive --, therefor.

In the Claims

In Column 9, Line 6, in Claim 1, delete "non-magnetoresitive" and insert -- non-magnetoresistive --, therefor.

In Column 9, Line 39, in Claim 3, delete "the the" and insert -- the --, therefor.

In Column 10, Line 2, in Claim 3, delete "proved" and insert -- provided --, therefor.

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*